United States Patent [19]

Fanucchi et al.

[11] Patent Number: 5,786,548
[45] Date of Patent: Jul. 28, 1998

[54] HERMETIC PACKAGE FOR AN ELECTRICAL DEVICE

[75] Inventors: Richard Fanucchi, Fountain Valley; Daniel A. Huang, West Hills; Bruce A. Igawa, Trabuco Canyon; Brill C. Paet, Laguna Niguel; Herbert T. Suyematsu, Los Angeles, all of Calif.

[73] Assignee: Hughes Electronics Corporation, Los Angeles, Calif.

[21] Appl. No.: 689,857

[22] Filed: Aug. 15, 1996

[51] Int. Cl.[6] ............................................. H05K 5/06
[52] U.S. Cl. .................... 174/50.54; 174/17 CT; 174/52.3
[58] Field of Search .................. 174/50.5, 50.51, 174/50.52, 50.54, 52.1, 52.3, 52.5, 17 CT

[56] References Cited

U.S. PATENT DOCUMENTS

| | | | |
|---|---|---|---|
| 3,340,602 | 9/1967 | Hontz | 29/588 |
| 4,486,622 | 12/1984 | Dathe et al. | 174/52.5 |
| 4,506,108 | 3/1985 | Kersch et al. | 174/52 FP |
| 4,560,084 | 12/1985 | Wolfson | 220/359 |
| 4,688,039 | 8/1987 | Berk | 340/870.17 |
| 4,744,850 | 5/1988 | Imano et al. | 156/265 |
| 4,760,240 | 7/1988 | Iikawa et al. | 219/121.64 |
| 5,258,577 | 11/1993 | Clements | 174/88 R |
| 5,445,308 | 8/1995 | Nelson | 228/121 |
| 5,455,446 | 10/1995 | Suppelsa et al. | 257/467 |
| 5,604,445 | 2/1997 | Desai et al. | 324/755 |

*Primary Examiner*—Dean A. Reichard
*Attorney, Agent, or Firm*—Terje Gudmestad; Michael W. Sales

[57] ABSTRACT

An electrical device package includes an aluminum header having a gold-coated sealing surface and an electrical device mounted within the boundary defined by the sealing surface. An annular gold-coated stainless steel seal ring registers with the sealing surface of the header. An annular bonding layer of a gold-tin alloy lies between, and registers with, the sealing surface of the aluminum header and the stainless steel seal ring. The electrical device is fastened to the header using an electrically and thermally conductive epoxy adhesive. A stainless steel cover has a flange which is welded to the seal ring to form a hermetically sealed package.

12 Claims, 2 Drawing Sheets

HERMETIC PACKAGE FOR AN ELECTRICAL DEVICE

BACKGROUND OF THE INVENTION

This invention relates to packaged electrical devices, and, more particularly, to an inexpensive, reliable hermetic package.

Many electrical devices are sealed into a hermetic package for use in environments which may be damaging to the device. As an example, it is common practice to package microwave devices in a hermetic package to ensure that the microwave device will not suffer a loss of performance due to corrosion, contamination, or material degradation. As used herein, "hermetic" means that the package prevents elements of an external environment from entering the interior of the package, to some specified very low level of leakage.

It has been common practice to build a hermetic package for a microwave device by supporting a ceramic substrate for the device on a header made of a metal such as Kovar® low-expansion alloy, a registered trademark of Carpenter Technology Corporation. Kovar[R] low-expansion alloy is an iron-nickel alloy that is formulated to have a low coefficient of thermal expansion. The Kovar[R] low-expansion alloy header is therefore compatible with the coefficient of thermal expansion of the ceramic substrate through temperature variations in assembly, test, and service, resulting in a highly reliable bonding configuration. After the microwave device is assembled on the aluminum oxide substrate or the surface of the header, a cover of Kovar[R] low-expansion alloy is attached to the header, as by resistance seam welding.

The Kovar® low-expansion alloy package stands as an industry standard for packaging, but has notable shortcomings. Kovar® low-expansion alloy is of relatively high material density, leading to an undesirably high weight for a package, and also is expensive to purchase and machine. Kovar® low-expansion alloy is also a relatively poor conductor of heat, so that the operating power of the microwave device may be limited by the low heat dissipation rate from the package. The joining of a ceramic, such as aluminum oxide or beryllium oxide, to the Kovar[R] low-expansion alloy header can be unreliable, and the joint can be damaged by some extreme conditions such as thermal and mechanical shock.

There remains a need for a light weight, thermally efficient package for electrical devices that is fully hermetic to within stringent limitations imposed by industry specifications. The package should be inexpensive to produce, robust, and compatible with a range of electrical devices. The present invention fulfills this need, and further provides related advantages.

SUMMARY OF THE INVENTION

This invention provides a hermetic electrical device package and a packaged electrical device. The packaging approach of the invention utilizes relatively inexpensive, readily available materials, which can be readily fabricated by casting and machining in a wide range of sizes and shapes appropriate for the electrical devices to be packaged. In a preferred form, no Kovar[R] low-expansion alloy at all is used in the package. The package has a capability for high levels of heat dissipation, a particular advantage for containing high-power electrical devices. The device package is assembled in a manner such that the electrical device is not subjected to extremes that could damage it. The device package is reliably manufactured with a high yield, and is reliable and robust through assembly, test, and service.

In accordance with the invention, an electrical device package comprises an aluminum header having a sealing surface and an annular stainless steel seal ring dimensioned to register with the sealing surface of the header. There is a means for joining the seal ring to the sealing surface of the aluminum header. A stainless steel cover has a flange dimensioned to register with the seal ring. The stainless steel cover is welded, preferably by a double seam weld, to the seal ring.

The means for joining the seal ring to the sealing surface of the aluminum header is preferably a solderable arrangement. In a preferred approach, the means for joining includes an annular layer of a soldering material dimensioned to lie between, and register with, the sealing surface of the aluminum header and the stainless steel seal ring. The preferred solderable material is a gold-tin alloy such as a composition, in weight percent, of 80 percent gold, 20 percent tin. The surface of the aluminum header and the facing surface of the stainless steel seal ring are plated with a material that is readily wetted by the soldering material, such as gold.

The electronic device is supported on the aluminum header or the alumina substrate. Feedthroughs in the header are provided as needed to permit external connections to the electronic device.

The package structure of the invention is typically prepared by first fabricating the required components by an appropriate approach that includes casting, machining, and/or forming. The selected materials are generally readily manufactured to the required shapes and tolerances. The feedthroughs are soldered into the aluminum header. The seal ring and means for joining the seal ring to the sealing surface are provided and stacked with the aluminum header. This assembly is heated to solder the seal ring to the aluminum header. The electrical device is thereafter attached to the aluminum header using a bonding material which has appropriate properties of electrical and thermal conductivity, structural compliance to accommodate the mismatch in coefficients of thermal expansion between the alumina substrate and the aluminum header, and has low outgassing. The cover is attached to the seal ring by seam welding along the flange of the cover. During seam welding, the electrical device need not be heated.

This approach provides a package and packaged electrical device that meet stringent hermeticity requirements in a robust, inexpensive system. Other features and advantages of the present invention will be apparent from the following more detailed description of the preferred embodiment, taken in conjunction with the accompanying drawings, which illustrate, by way of example, the principles of the invention.

DETAILED DESCRIPTION OF THE INVENTION

Figure 1:
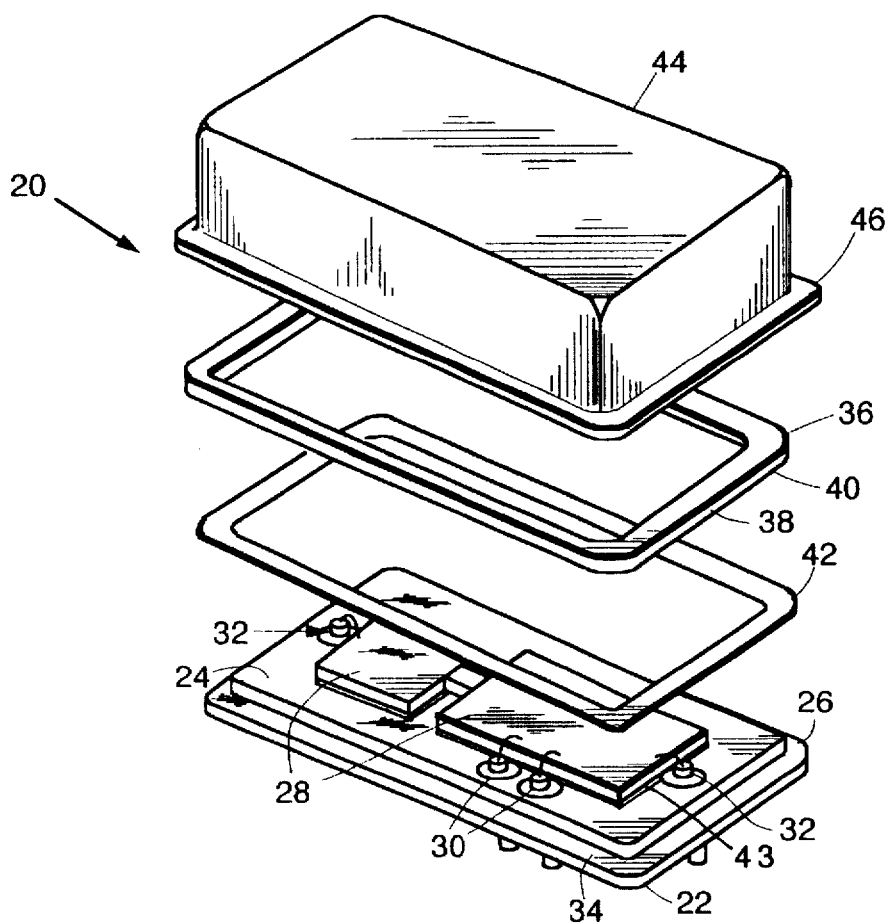
FIG. 1 is a perspective exploded view of an electrical device package according to the invention.
Figure 2:
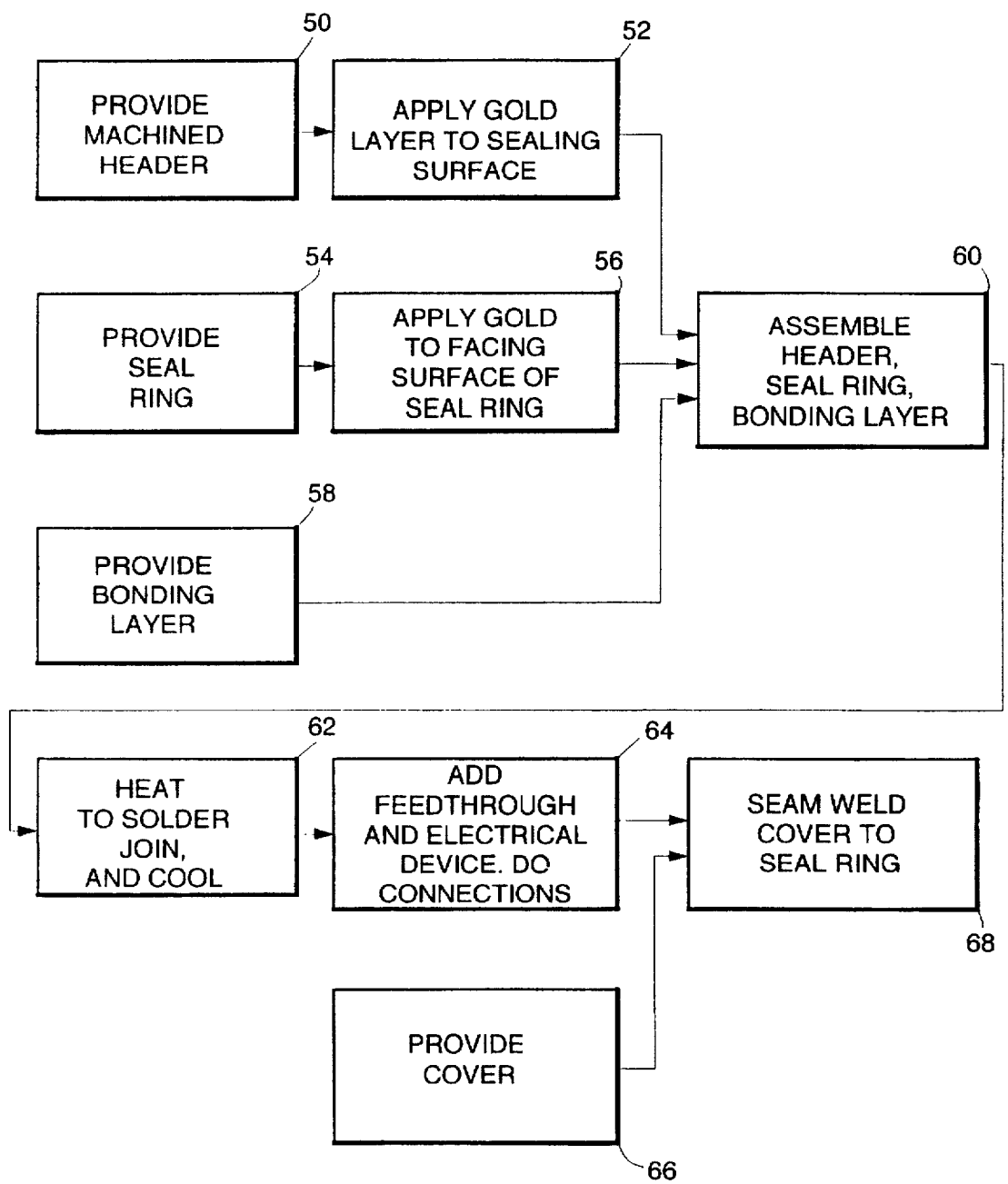
FIG. 2 is a process flow diagram for the fabrication of the electrical device package of FIG. 1.

FIG. 1 depicts in exploded perspective view an electrical device package 20 according to the invention, and FIG. 2 illustrates in block diagram form a method for fabricating the package 20. The package 20 includes a header 22 made of aluminum. As used herein, "aluminum" includes both pure aluminum and alloys based upon aluminum. In the present case, the header 22 is preferably made of the aluminum alloys 380 or A108. The header 22 is provided and machined, numeral 50, to have a central support region 24 and a sealing surface 26. The sealing surface 26 is preferably a flat, upwardly facing surface extending around the periphery of one face of the header 22, with the support region 24 within the boundary defined by the sealing surface 26. The support region 24 is sized to receive an electrical device 28 thereon, but the electrical device 28 is not placed onto the support region 24 at this stage of the fabrication procedure. Openings for feedthroughs such as DC feedthroughs 30 and RF feedthroughs 32 are machined as well in the support region 24, but the feedthroughs are preferably not placed into the openings at this stage of the fabrication procedure.

A first layer of gold 34 is applied to the sealing surface 26, numeral 52. The first gold layer 34 is preferably applied by electrodeposition using conventional techniques. The thickness of the first gold layer 34 is not critical, but is preferably about 0.0001 inches.

An annular seal ring 36 is provided, numeral 54. As used herein, "annular" is used in a broad sense to mean a solid, generally planar structure bounded by an outer boundary and an inner boundary. The term "annular" is sometimes used to refer to a structure wherein the boundaries are circular and concentric, but the term is not so narrowly defined here. Here, "annular" may be preceded by a descriptor for the overall shape of the structure. For example, FIG. 1 depicts a seal ring 36 in the shape of a rectangular annulus, wherein the outer and inner boundaries of the solid are rectangles.

The seal ring 36 is made of a stainless steel. As used herein, the term "stainless steel" means any iron-base alloys to which sufficient alloying elements are added to substantially resist corrosion in a particular environment. In the present case, the seal ring 36 is preferably made of 302 or 304 stainless steel. In one preferred embodiment of a package 20 designed for use with microwave devices in the 0–22 Gigahertz range, the seal ring has outer boundary dimensions of 0.750 inches by 1.14 to 2.31 inches, and a thickness of 0.030 inches. (These dimensions are presented to illustrate the size of a preferred embodiment, but the invention is not limited to such dimensions.) The seal ring is dimensioned to register with the sealing surface 26 of the header 22.

A second gold layer 38 is applied to a lower face 40 of the seal ring 36, numeral 56. The lower face 40 of the seal ring is that face which, when the package is assembled, faces the sealing surface 26 of the header 22. The second gold layer 38 is preferably applied in the same manner, and in the same thickness, as the first gold layer 34. In a preferred approach, the first gold layer 34 is plated onto the sealing surface 26 of the header and the second gold layer 38 is plated onto the seal ring in a single process.

A bonding layer 42 is provided, numeral 58. The bonding layer is an annulus that registers with the sealing surface 26 of the header 22 and with the lower face 40 of the seal ring 36. The bonding layer 42 is preferably about 0.004 inches thick. The bonding layer is made of a material that is solderable to join the header 22 and the seal ring 36 upon heating. In a preferred embodiment, the bonding layer 42 is made of a gold-tin alloy, most preferably of a composition, in weight percent, of about 80 percent gold, 20 percent tin. This bonding layer material solders well to the gold-coated sealing surface 26 and the gold-coated lower face 40.

The header 22, bonding layer 42, and seal ring 36 are assembled with the bonding layer 42 positioned between the first gold layer 34 of the sealing layer 26 and the second gold layer 38 on the lower face 40 of the seal ring 36, numeral 60. This assembled stack is heated to a temperature sufficiently high to melt the bonding layer, numeral 62. The molten metal of the bonding layer wets the gold layers 34 and 38. Upon cooling, a soldered hermetic joint is formed between the header 22 and the seal ring 36.

The use of a gold-coated sealing surface, gold-tin bonding layer, and gold-coated lower face of the seal ring is the preferred approach to joining the header 22 and the seal ring 36. However, any other operable approach can be used as well. For example, a gold-tin layer could be deposited upon one, or preferably both, of the faces 26 and 40 to be bonded. After assembly of the stack, heating, and cooling, the structure would be bonded together in much the same manner as discussed for the preferred embodiment. Alternatively, an explosively bonded laminate could be used.

At this point, the electrical device structure is fastened onto the central region 24 of the header 22, numeral 64. The feedthroughs 30 and 32 are inserted into the openings provided in the header 22 and fastened in place, as by soldering. Any type of operable hermetic feedthrough can be used, as long as a highly reliable hermetic seal of the feedthrough to the aluminum header 22 is formed. In an alternative but less preferred approach, the feedthroughs can be placed into their respective openings with solder present, prior to the heating step 62, and soldered into place during step 62. In the preferred approach, where the feedthroughs are soldered into place after the step 62 so that a good alignment can be more readily achieved, a low-temperature solder such as SN96 (having a composition of about 96 weight percent tin, about 3.9 weight percent lead, and about 0.1 weight percent silver) is used to solder the feedthroughs in place, so that the previously soldered joint is not affected. The electrical device or devices 28 are fastened to the central region 24 of the header 22, preferably using a gold-filled, electrically and thermally conductive, low-outgassing, flexible epoxy adhesive layer 43. This adhesive accommodates thermal mismatches between the device 28 and the aluminum header, so that a good bond is retained during assembly, test, and service. Electrical connections between the electrical device(s) and the feedthrough(s) are made by conventional procedures such as thermosonic bonding of fine wire leads.

A stainless steel cover 44 is provided, numeral 66. The stainless steel cover 44 is preferably made of the same stainless steel material as the seal ring 36. The cover 44 has a peripheral flange 46 dimensioned to register with the seal ring 36.

The stainless steel cover 44 is attached to the seal ring 36 with a hermetic seal, numeral 68. The attachment is preferably accomplished by welding, and most preferably by the known technique of resistance seam welding. In this approach, an electrical resistance welding roller is passed along parallel edges of the surface of the flange 46, fusing the stainless steel of the flange 46 and the seal ring 36 together. For a rectangular package as shown in the drawings, two passes are made along the parallel edges of the periphery. The welding is performed in an atmosphere of nitrogen with a trace of helium. The presence of the helium inside the package 20 can thereafter be used to determine whether hermeticity is achieved, by the well known process of helium leak checking.

The approach of the invention has been practiced on a number of electrical device structures using the approach discussed above. After fabrication, the packages were tested for leakage according to MIL-STD-883C, which provides for a leak rate of less than $5 \times 10^{-8}$ standard cubic centimeters per second. The packages satisfactorily met this standard. Additionally, the electrical devices were successfully operated at microwave frequencies of about 0–22 Gigahertz without loss of hermeticity. The packages were further evaluated by pyrotechnic shock simulation with a peak of 10,000 times the force of gravity, with 24 times the force of gravity (G), root mean square (GRMS) random vibration testing, and in thermal cycling between –60° C. and 150° C. The packages passed all of these tests.

Although a particular embodiment of the invention has been described in detail for purposes of illustration, various modifications and enhancements may be made without departing from the spirit and scope of the invention. Accordingly, the invention is not to be limited except as by the appended claims.

What is claimed is:

1. An electrical device package, comprising:

an aluminum header having a sealing surface;

an annular stainless steel seal ring dimensioned to register with the sealing surface of the header;

means for joining the seal ring to the sealing surface, of the aluminum header including a first layer of gold on the sealing surface of the aluminum header, and a second layer of gold on a portion of the seat ring facing the sealing surface of the aluminum header; and a stainless steel cover having a flange dimensioned to resister with the seal ring.

2. An electrical device package, comprising:

an aluminum header having a sealing surface;

an annular stainless steel seat ring dimensioned to register with the sealing surface of the header;

means for joining the seal ring to the sealing surface of the aluminum header including an annular bonding layer of a solderable material dimensioned to lie between, and register with, the sealing surface of the aluminum header and the stainless steel seal ring; and a stainless steel cover having a flange dimensioned to register with the seal ring.

3. An electrical device package comprising:

an aluminum header having a sealing surface;

an annular stainless steel seal ring dimensioned to resister with the sealing surface of the header;

means for joining the seal ring to the sealing surface of the aluminum header including an annular bonding layer of gold-tin alloy dimensioned to lie between, and register with, the sealing surface of the aluminum header and the stainless steel seal ring; and a stainless steel cover having a flange dimensioned to register with the seal ring.

4. The package of claim 3, wherein the annular bonding layer has a composition, in weight percent, of about 80 percent gold, 20 percent tin.

5. An electrical device package, comprising:

an aluminum header having a sealing surface;

an annular stainless steel seal ring dimensioned to register with the sealing surface of the header;

an annular bonding layer of a gold-tin alloy dimensioned to lie between, and register with, the sealing surface of the aluminum header and the stainless steel seal ring;

a stainless steel cover having a flange dimensioned to register with the seal ring; and a weld joint between the seal ring and the flange of the cover.

6. The package of claim 5, further including a first layer of gold on the sealing surface of the aluminum header; and a second layer of gold on a portion of the seal ring facing the sealing surface of the aluminum header.

7. The package of claim 5, further including a feedthrough extending through the aluminum header.

8. The package of claim 5, wherein the seal ring is a rectangular annulus.

9. The package of claim 5, further including an electronic device supported on the aluminum header within a boundary defined by the sealing surface.

10. The package of claim 9, further including a gold-filled, electrically and thermally conductive adhesive layer between the electronic device and the aluminum header.

11. A method for preparing an electrical device package, comprising the steps of:

providing an aluminum header having a sealing surface;

providing an annular stainless steel ring dimensioned to regiter with the sealing surface of the header;

placing an annular bonding layer of a solderable material between the sealing surface of the aluminum header and the stainless steel ring; and heating the aluminum header, the bonding layer of solderable material, and stainless steel ring to a temperature above the melting point of the solderable material thereby joining the seal ring to the sealing surface of the aluminum header; and welding to the seal ring a stainless steel cover having a flange dimensioned to register with the seal ring.

12. The method of claim 11, wherein the step of placing includes the step of providing said annular bonding layer of a gold-tin alloy.

* * * * *